(12) United States Patent
Coenen

(10) Patent No.: US 10,833,513 B2
(45) Date of Patent: Nov. 10, 2020

(54) METHOD, SYSTEM AND DEVICE FOR BALANCING INDIVIDUAL ELECTRIC ENERGY STORAGE CELLS

(71) Applicant: VITO NV, Mol (BE)

(72) Inventor: Peter Coenen, Mol (BE)

(73) Assignee: VITO NV, Mol (BE)

( * ) Notice: Subject to any disclaimer, the term of this patent is extended or adjusted under 35 U.S.C. 154(b) by 149 days.

(21) Appl. No.: 16/062,181

(22) PCT Filed: Dec. 23, 2016

(86) PCT No.: PCT/EP2016/082665
§ 371 (c)(1),
(2) Date: Jun. 14, 2018

(87) PCT Pub. No.: WO2017/109226
PCT Pub. Date: Jun. 29, 2017

(65) Prior Publication Data
US 2018/0366959 A1 Dec. 20, 2018

(30) Foreign Application Priority Data

Dec. 24, 2015 (EP) .................................... 15202756
Mar. 2, 2016 (EP) .................................... 16158197

(51) Int. Cl.
*H02J 7/00* (2006.01)
*G01R 31/392* (2019.01)
*G01R 31/3842* (2019.01)

(52) U.S. Cl.
CPC ........ *H02J 7/0026* (2013.01); *G01R 31/3842* (2019.01); *G01R 31/392* (2019.01);
(Continued)

(58) Field of Classification Search
CPC ...... H02J 7/0026; H02J 7/0018; H02J 7/0016; H02J 7/0019; H02J 7/0014; G01R 31/3842; G01R 31/392
See application file for complete search history.

(56) References Cited

U.S. PATENT DOCUMENTS

2011/0241622 A1* 10/2011 Li ........................ H01M 10/42
320/116
2012/0139553 A1* 6/2012 Nortman ............... H02J 7/0016
324/537
(Continued)

FOREIGN PATENT DOCUMENTS

EP 2302757 3/2011
WO 2006/058394 6/2006
(Continued)

OTHER PUBLICATIONS

International Search Report for PCT/EP2016/082665 dated Mar. 27, 2017.
(Continued)

*Primary Examiner* — Drew A Dunn
*Assistant Examiner* — Sailesh Thapa
(74) *Attorney, Agent, or Firm* — Bacon & Thomas, PLLC

(57) ABSTRACT

Methods and systems for monitoring individual cell voltages of an energy storage system. The measured cell voltages can be reported back to a central controller. Based on parameters such as the overall health of the system, this controller can be adapted to decide which cells to balance, in which direction and optionally for how long. Balancing can be performed by cell monitoring and balancing units which can be implemented in hardware, i.e. as one or more circuits. The decision information from the controller can be reported to the cell monitoring and balancing units as a command. The cell monitoring and balancing means can execute the
(Continued)

command, for example irrespective of the voltage or SoC of the cell connected to it.

20 Claims, 4 Drawing Sheets

(52) U.S. Cl.
CPC .......... *H02J 7/0016* (2013.01); *H02J 7/0018* (2013.01); *H02J 7/0019* (2013.01)

(56) References Cited

U.S. PATENT DOCUMENTS

| | | | | |
|---|---|---|---|---|
| 2014/0217982 | A1* | 8/2014 | Ohkawa | H02J 7/0016 320/118 |
| 2014/0361743 | A1* | 12/2014 | Lin | H02J 7/0014 320/109 |
| 2015/0037624 | A1* | 2/2015 | Thompson | H01M 10/425 429/50 |
| 2017/0067967 | A1* | 3/2017 | Bryngelsson | B60L 58/16 |
| 2018/0198289 | A1* | 7/2018 | Sugeno | H02J 7/0016 |

FOREIGN PATENT DOCUMENTS

| | | |
|---|---|---|
| WO | 2011/036147 | 3/2011 |
| WO | 2011/158051 | 12/2011 |

OTHER PUBLICATIONS

Written Opinion for PCT/EP2016/082665 dated Mar. 27, 2017.
Extended Search Report for corresponding European application 16158197.0-1804 dated Dec. 7, 2016.
European Office Action in related European Application No. 16826065.1-1202, dated Apr. 1, 2019.

* cited by examiner

METHOD, SYSTEM AND DEVICE FOR BALANCING INDIVIDUAL ELECTRIC ENERGY STORAGE CELLS

The present invention relates to a method, a system and/or a device for balancing individual electric energy storage cells in for example an electric energy storage system.

BACKGROUND

Electric energy storage systems are composed of cells such as electrostatic (capacitor) cells or electrochemical cells e.g. in (batteries). Preferably, the cells are rechargeable. In such system, charging or discharging the system often end when any of these cells is full or empty. Some systems do allow overcharging of some cells but this is not preferred as overcharging can damage cells or reduce their lifetime and in the case of lead acid batteries results in the generation of hydrogen which is a flammable gas. Hence, in order to maximize the system's capacity, the charge in all cells should be balanced.

Charge level in cells can be characterized by the cell voltage, the cell's state of charge [%] and/or depth of discharge. To determine this, individual cell voltage measurements can be acquired that can be used as is or that can be converted to SoC (State of Charge) by combining the measured values with a current measurement as well as application of SoC estimation techniques known from the prior art.

When cells are connected is series, they see equal electric current. The cells are never exactly equal and the lack of equality can increase with age. The capacity of such a string is maximal if the smallest cell limits both charging and discharging. Thus, the charge level in every cell must be monitored and corrected where necessary to assure this. Deviations of charge level in cells can occur by self-discharge, small isolation faults, tolerances in individually connected components . . . .

Not balancing cells may lead to cells being overcharged or overdischarged. Balancing cells when they approach their voltage or SoC limit does not guarantee that the voltage limits are respected as the balancing current is often some magnitudes smaller than charge or discharge currents.

Balancing is conventionally performed at cell level: voltage is measured and when it passes a certain threshold, action is taken, e.g. discharge of individual cells. The action is stopped when the voltage returns to the threshold value. In some cases, balancing is inherent to the electric balancing circuit as cells are charged or discharged to equal voltage. In other cases, cells may be charged or discharged under control of a controller that acts upon voltage thresholds. In other cases hardware allows only discharging to a constant voltage, for example.

SUMMARY OF THE INVENTION

In accordance with embodiments of the present invention methods, devices and systems are proposed such that individual cell voltages of an energy storage system are monitored. The measured cell voltages can be reported back to a central controller. Based on parameters such as the overall health of the system, this controller can be adapted to decide which cells to balance, in which direction and optionally for how long. Balancing can be performed by cell monitoring and balancing means which can be implemented in hardware, i.e. as one or more circuits. The decision information from the controller can be reported to the cell monitoring and balancing means as a command. The cell monitoring and balancing means can execute the command, for example irrespective of the voltage or SoC of the cell connected to it. Suitable cell monitoring and balancing circuits i.e. hardware for connecting to the cells are described in WO 2011/036147 A2 which is incorporated herein by reference in its entirety.

Accordingly, the present invention can provide a method step and a means to determine overall health of the system. For example a controller can be adapted to determine health by one or more cell's capacity.

The present invention can provide a method step and a means to decide which cells to balance, e.g. for charging and discharging or for example for batteries or capacitor cells.

The present invention can provide a method step and a means to decide which direction, i.e. charging or discharging is to be applied during balancing. This may be adapted to batteries or capacitor cells.

The present invention can provide a method step and a means to decide for how long the balancing (e.g. charging or discharging) is to be carried out The present invention can provide a method step and a means to perform balancing which can be performed by cell monitoring whereby the balancing means is implemented in hardware, i.e. as one or more circuits, e.g. a switch to enable balancing.

The present invention can provide a method step and a means to report decision information from a controller to a cell monitoring and balancing means as a command.

The present invention can provide a method step and a means to provide cell monitoring and balancing which can execute such a command, for example irrespective of the voltage or SoC of the cell connected to it.

The advantages of embodiments of the present invention are one or more or all of:

- Cell balancing can be performed at any time. Balancing is not restricted to the cell being in a certain situation (e.g. near full charge). Thus, the balancing time is extended and the balancing power can be reduced. This results in space and cost savings.
- Cells are not balanced with regard to individual performance but to optimal system performance leading to higher energy storage capacity.
- Overvoltage on cells is prevented because the central controller can calculate the maximum system voltage based on the highest individual voltage. The maximum system voltage is communicated to the charge circuit. Undervoltage protection works in a similar way. This method of protection allows for the elimination of safety margins, thus increasing the system's real storage capacity.
- Cell balancing can be performed even without the use of a balancing charger. This is in particular useful if charging is performed by renewables or by brake energy.
- The central controller can account for differences in cell capacity and internal resistance thus making more accurate predictions of voltage or SoC. This information is used to better control the system's bulk charging and discharging so that each individual cell remains within its safe operating area.
- The control of loading, e.g. discharging or charging avoids damaging cells while they are unbalanced. The loading, e.g. charging or discharging can be done with monitoring individual cell voltages or charge state, but merely the overall battery voltage or charge state.

A capacitor's battery's safe operating area (voltage/charge . . . ) can be determined based on all cell states (e.g. voltage or charge state).

In a first aspect, the present invention relates to a system for charge balancing of a plurality of rechargeable energy storage devices or cells coupled in series, said system comprising a plurality of balancing units each assigned to one of the rechargeable energy storage devices or cells, an electric charging device such as an AC signal generator for providing an AC signal to the plurality of balancing units, each balancing the charge on their assigned rechargeable energy storage devices or cells, whereby balancing of a cell is carried out independently of whether the system as a whole is being discharged through a load or is being charged or is idle.

By making a balancing decision and determining a time for balancing independent of whether the system as a whole is being discharged through a load or is being charged or is idle means that the health of cells can be optimised.

Optionally, there can be a capacitive or inductive coupling between the AC signal generator and each of the plurality of balancing units for common mode rejection. One or more AC generators can be assigned to a plurality of balancing units.

In a system according to embodiments of the present invention, a particular balancing unit, hereinafter called first balancing unit, comprises a plurality of switches for transferring, on the one hand, charge from an electric charging device such as the AC signal generator or from an energy storage device or cell assigned to another balancing unit for charging the energy storage device or cell assigned to the first balancing unit, and, on the other hand, for transferring charge to the electric charging device such as the AC signal generator or to an energy storage device or cell assigned to another balancing unit for discharging the energy storage device or cell assigned to the first balancing unit.

In particular embodiments of the present invention, each balancing unit is provided with a plurality of switches as the hereinabove described for the first balancing unit.

The plurality of switches for transferring charge from or to the electric charging device such as the AC signal generator or from or to an energy storage device or cell assigned to a balancing unit may comprise or may be active switches.

A system according to embodiments of the present invention may furthermore comprise a comparator for comparing an instantaneous electrical parameter such as voltage, charge, state of charge, state of health of the rechargeable energy storage device with a corresponding reference parameter or threshold value. Voltage may be measured by a microcontroller and may either be transmitted to a main controller for comparison with a reference parameter value, or may be compared locally with a predetermined threshold value. Other parameters may be derived by calculation.

The electrical parameter can be a derived value such as an amount of charge in the energy storage device or an amount of charge left in the energy storage device or a SoC of the energy storage device.

In particular embodiments, a balancing unit comprises exactly two switches. The balancing units may comprise a controller for controlling the switches or the controller may be provided for a module of balancing units. The controller may be adapted for controlling the switches based on a signal generated by the comparator.

A system according to embodiments of the present invention may furthermore comprise a main controller, i.e. a controller not local to the balancing units, for controlling which ones of the rechargeable energy storage devices need to be balanced. The main controller may then be adapted for determining the reference parameter for each individual balancing unit.

In such embodiments, the balancing system may furthermore comprise a data bus for communication between a local controller of a balancing unit and the main controller, or between a module controller and the main controller, e.g. preferably between the local controllers of each balancing unit and the main controller.

In accordance with embodiments of the present invention, a controller or the main controller is preferably adapted for protecting the rechargeable energy storage devices or cells against overvoltage and/or undervoltage. This may for example be obtained for a vehicle with an energy storage system during electrical braking, where energy from braking is used for charging the energy storage devices or cells.

A system according to embodiments of the present invention may comprise a single electric charging device such as a single AC signal generator common to the plurality of balancing circuits.

A system according to embodiments of the first aspect of the present invention may be incorporated in a rechargeable energy storage system.

In a second aspect, the present invention provides a rechargeable energy storage system comprising a string of rechargeable energy storage devices coupled in series, and a system for balancing charge over the rechargeable energy storage devices in accordance with embodiments of the first aspect of the present invention.

In a third aspect, the present invention relates to a method for charge balancing of a rechargeable energy storage device over a plurality of rechargeable energy storage devices or cells coupled in series, the rechargeable energy storage devices or cells having two terminals, said method comprising measuring an instantaneous parameter of an energy storage device or cell, the parameter being an amount of charge discharged from the energy storage device or cell or an amount of charge left in the energy storage device or cell or a derived value such as a SoC of the energy storage device or cell, comparing the measured parameter to a pre-determined parameter value, and depending on the comparison result, transferring charge to or away from the energy storage device or cell by actuating switches independently of whether the system as a whole is being discharged into a load or is being charged or is idle.

Transferring charge optionally comprises providing an AC signal to a balancing unit coupled to the rechargeable energy storage device or cell, the balancing unit applying the AC signal to the rechargeable energy storage device or cell or not depending on the comparison result; transferring charge including common mode rejection by capacitive or inductive coupling.

Considering Capacitor Cells:

Each rechargeable energy storage device or cell has a maximum safe voltage Vmax, and the actual measured voltage of the nth cell is Vn and $Q_n$ is given by equation (1):

$$(V_{max}-V_n)*C_n=Q_n \tag{1}$$

where
$V_{max}$=maximum allowed cell voltage
$V_n$=voltage of cell n [V]
$C_n$=capacity of cell n [F]
$Q_n$=the charge that can be accepted [C]
whereby the value of $Q_n$ relates to the charge that can be accepted by the cell to bring it to maximum charge and voltage, the cell with the lowest value of Q is discharged.

Hence the cell is selected with the lowest value of Q which is a step of finding which cells to balance and a means for performing the finding operation.

The value $C_n$ in any of the formulas relates to the health of a cell, hence determining $C_n$ is a step of determining the health of a cell as well as providing a means to determine the health.

The cell will be discharged independently of whether the energy storage device is discharging into a load or is being charged or is idle.

Q' is the amount of charge left in an energy cell, $V_{min}$ is the lowest allowed voltage state of complete useful discharge, and $Q_n$ is given by equation (2):

$$(V_n - V_{min}) * C_n = Q'_n \qquad (2)$$

the cell with the lowest value of Q' is charged independently of whether the energy storage device is discharging into a load or is being charged or is idle. Hence the cell is selected with the lowest value of Q' which is a step of finding which cells to balance and a means for performing the finding operation.

Equation (1) can be evaluated when $V_n$ is close to $V_{max}$ or equation (2) can be evaluated when $V_n$ is close to $V_{min}$.

As a further step a threshold value $V_t$ can be calculated in accordance with equation (3)

$$V_t = V_{max} - k*t - S \qquad (3)$$

where
- k=a decay constant expressed in V/s (e.g. 0.01 V/sec)
- t=elapsed time since last evaluation.
- S=a safety margin to avoid unwanted behaviour e.g. immediately after starting or after cell replacements, and if $V_n$ exceeds $V_t$, equation (1) is evaluated, t is reset to 0 and balancing decisions are made.

As a further step a threshold value $V'_t$ can be calculated in accordance with equation (4)

$$V'_t = V_{min} + k*t + S \qquad (4)$$

where
- k=a decay constant expressed in V/s (e.g. 0.01 V/sec)
- t=elapsed time since last evaluation.
- S=a safety margin to avoid unwanted behaviour e.g. immediately after starting or after cell replacements, and if $V_n$ is lower than $V'_t$, equation (2) is evaluated, t is reset to 0 and balancing decisions are made.

Considering Battery Cells:

Alternatively $Q_n$ or $Q'_n$ can be calculated by equations (1') and (2') respectively:

$$(1-SoC)*C_n = Q_n \qquad (1')$$

$$(SoC)*C_n = Q'_n \qquad (2')$$

Balancing can be started for a preset time cell-by-cell as defined in equation (5):

$$t_{balance} = Q_n/I_{balance} \text{ or } t_{balance} = Q'_n/I_{balance} \qquad (5)$$

where $t_{balance}$ is the time set for balancing, and $I_{balance}$ is the balancing current used.

This discloses a means for and a method step of determining how long the balancing should go on, e.g. for battery cells.

Cell Balancing of Battery Cells:

$$(1-SoC)*C_n = Q_n \qquad (1')$$

$$(SoC)*C_n = Q'_n \qquad (2')$$

Where $C_n$ is the cell capacity in C or As.

The balancing method for capacitors described above can be applied to batteries whereby the SoC can be used for the calculation of $Q_n$ or $Q'_n$ which is used in the decision to balance as described above.

Preferably optimal system performance is achieved taking into account the cell's capacity.

A further step can be communicating to a bulk load or charger when to end charging and/or discharging by checking individual cell voltages against their upper or lower limits and interrupting charge or discharge when a voltage goes beyond a limit.

Yet a further step can be, when the current to/from a storage device is interrupted, the voltage will abruptly change whereby to avoid oscillating behaviour, in absence of cell voltage measurements, compare the system voltage to a limit value, For capacitor cell systems, the limit value can be calculated as follows:

If individual cell capacities are not known, they are considered equal $$V_{upperlimit} = V_{system} + N*(V_{max} - V_n) \qquad (6)$$

where
- $V_{max}$=upper limit of cell voltage
- $V_n$=highest individual cell voltage If the individual cell capacities are known:
using (1), calculate $Q_n$, retain the lowest value: $Q_1$ $$V_{upperlimit} = \Sigma_{n=1 \ldots N}(V_n + Q_1/C_n) \qquad (7)$$

For battery cell systems, the limit value is calculated as follows:

If individual cell capacities are not known, they can be considered equal (as a first approximation) and equation (8) can be used. If the relationship between SoC and cell voltage is not known, equation (8) can be used.

$$V_{upperlimit} = V_{system} + N*(V_{max} - V_n) \qquad (8)$$

If the individual cell capacities are known and the relationship between SoC and cell voltage is known, e.g. as part of the algorithm to determine SoC: using equation (1'), calculate $Q_n$, retain the lowest value: $Q_1$ for every cell, calculate the expected voltage when adding $Q_1$:

$$V_{nf} = \text{lookup\_EMF}(SoC + Q_1/C_n)$$

$$V_{upperlimit} = \Sigma_{n=1 \ldots N} V_{nf}$$

The function lookup_EMF allows to determine a cell voltage based on its SoC. The relationship is generally supplied as part of a battery cell's data sheet and sometimes referred to as "voltage vs SoC" curve.

It is an advantage of embodiments of the present invention that they provide a charge balancing device or method which can be used for an improved balancing of even large series connections of energy storage devices or cells. It is an advantage of embodiments of the present invention that only a few cells need to be serviced, in which energy storage devices have voltages that deviate from an average cell voltage. It is an advantage of embodiments of the present invention that both the voltage of cells with a low voltage can be increased and voltage of cells with a high voltage can be reduced independently of what is happening with other cells in the system. It is an advantage of embodiments of the present invention that all cells can be charged or discharged towards any average cell voltage for the string of cells. It is an advantage of embodiments of the present invention that they provide a charge balancing device or method with which charging does not need to stop once a maximum voltage level is reached for one of the cells. It is an advantage of embodiments of the present invention that a plurality of cells can be serviced for charge balancing at the same time and that some cells can be charged and some discharged at the same time. It is an advantage of embodiments of the present invention that cells can be protected against overvoltage and undervoltage by communicating with the charger or load.

In a further aspect the present invention provides balancing of individual electric energy storage cells in an electric energy storage system comprising:
individual electric energy storage cells connected in series, means for measuring an electrical parameter of individual cells related to cell health, charge or state of charge,
a controller,
means for reporting measured parameter values to the controller,
the controller being adapted to decide if one or more individual cells is/are to be balanced and in which direction, the decision being based on the measured parameter,
a balancing unit being connected to a measured cell and being adapted for receiving a balancing command from the controller and for performing cell balancing of the cell connected to it independently of whether the energy storage system as a whole is being charged or discharged or is idle.

Cell balancing can be carried out according to any of the following:
(i) at any time, or
(ii) balancing is not restricted to the balanced cell being in a certain situation state of charge, or
(iii) without regard for individual performance, or
(iv) with regard to optimal system performance leading to higher energy storage capacity, or
(v) to prevent overvoltage or undervoltage on cells by the controller being adapted calculate a maximum system or a minimum system voltage based on a highest or lowest individual cell voltage, respectively, or
(vi) without use of a balancing charger, or
(vii) the controller taking account for differences in cell capacity and internal resistance in predictions of voltage or SoC, or
(viii) for a set period of time.

A first balancing unit can be provided which comprises a plurality of switches for transferring, on the one hand, charge from an electric charging device or from an energy storage cell assigned to another balancing unit for charging the energy storage cell assigned to the first balancing unit, and, on the other hand, for transferring charge to the energy charging device or to an energy storage cell assigned to another balancing unit for discharging the energy storage cell assigned to the first balancing unit independently of whether the energy storage system as a whole is being charged or discharged or is idle.

A comparator can be provided for comparing a measured electrical parameter of an energy storage cell with a corresponding reference parameter or threshold value. The electrical parameter can be a derived value such as an amount of charge in the energy storage cell or an amount of charge left in the energy storage device or a SoC of the energy storage device. The controller can be adapted for controlling the switches based on a signal generated by the comparator. The controller can be adapted for protecting the rechargeable energy storage devices against overvoltage and/or undervoltage.

In another aspect a method for balancing individual electric energy storage cells in an electric energy storage system is provided, the system comprising: individual energy storage cells connected in series, the method comprising:
measuring an electrical parameter of individual cells related to cell health, charge or state of charge,
deciding if one or more individual cells are to be balanced and in which direction, the decision being based on the measured parameter values, and
performing cell balancing of the one or more cells independently of whether the energy storage system as a whole is being charged or discharged or is idle.

Cell balancing can be carried out according to any of the following:
(i) at any time, or
(ii) balancing is not restricted to the balanced cell being in a certain situation state of charge.
(iii) without regard for individual performance, or
(iv) with regard to optimal system performance leading to higher energy storage capacity
(v) to prevent overvoltage or undervoltage on cells by the controller being adapted calculate a maximum system or a minimum system voltage based on a highest or lowest individual cell voltage, respectively, or
(vi) without use of a balancing charger, or
(vii) the controller taking account for differences in cell capacity and internal resistance in predictions of voltage or SoC, or
(viii) for a set period of time.

The method can include transferring, on the one hand, charge from an electric charging device or from an energy storage cell assigned to another balancing unit for charging the energy storage cell assigned to the first balancing unit, and, on the other hand, for transferring charge to the electric charging device or to an energy storage cell assigned to another balancing unit for discharging the energy storage cell assigned to the first balancing unit independently of whether the energy storage system as a whole is being charged or discharged or is idle.

The method can include comparing a measured electrical parameter of an energy storage cell with a corresponding reference parameter or threshold value.

The electrical parameter can be a derived value such as an amount of charge in the energy storage cell or an amount of charge left in the energy storage cell or a SoC of the energy storage cell.

The method can include controlling the switches based on a signal generated by the comparator. A further step can be protecting the rechargeable energy storage cells against overvoltage and/or undervoltage.

A further aspect of the present invention is a computer program product which can be stored on a non-transitory signal storage means such as an optical disk (CD-ROM or DVD-ROM), a magnetic disk, a magnetic tape, a solid state memory such as a flash memory. The computer program product comprises software which when executed on a processing engine such as a microprocessor or an FPGA implements any of the methods of the present invention.

DETAILED DESCRIPTION OF THE INVENTION

Figure 1:
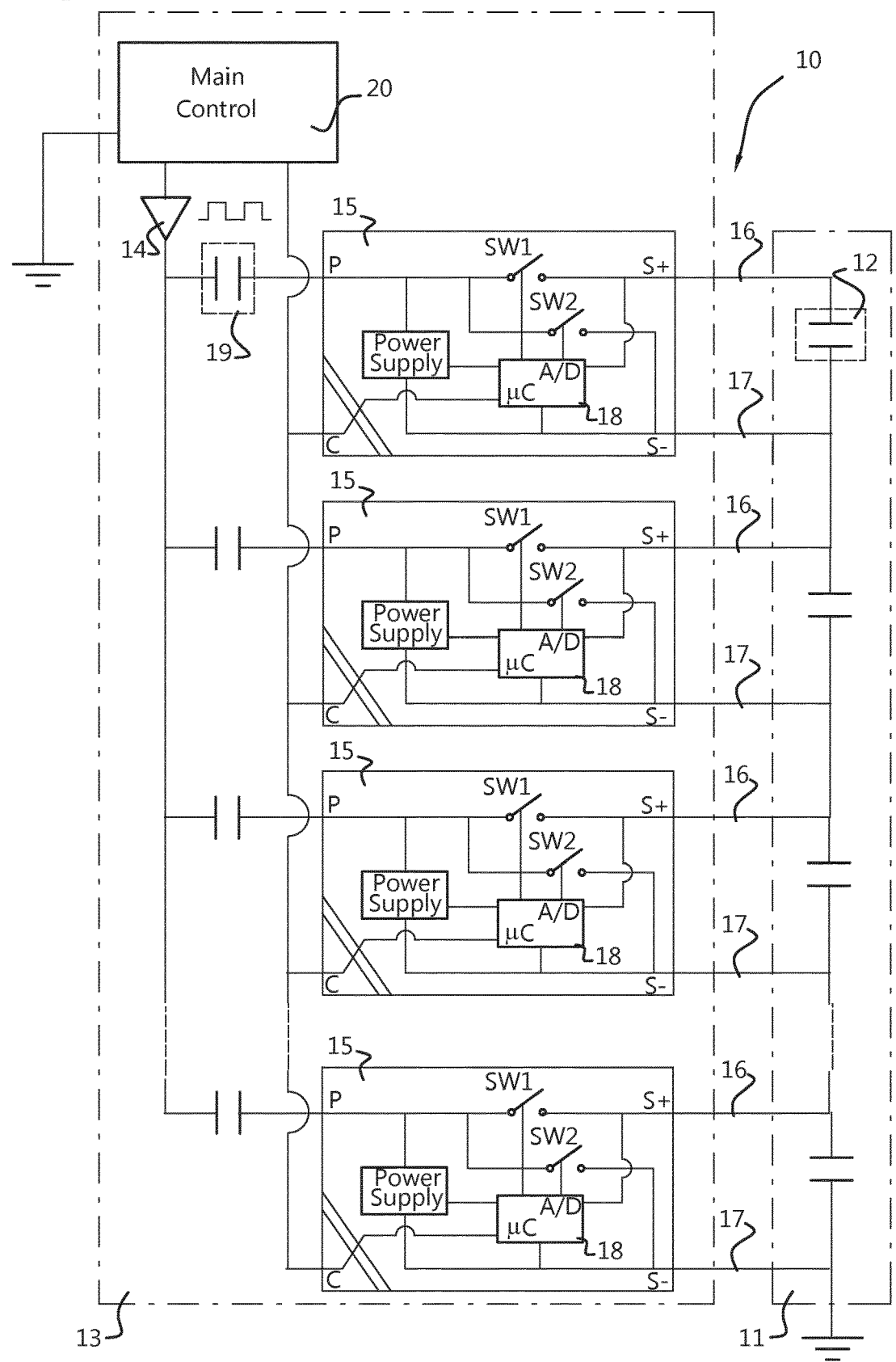
FIG. 1 a circuit diagram of a balancing system according to an embodiment of the present invention.

The present invention will be described with respect to particular embodiments and with reference to certain drawings but the invention is not limited thereto but only by the claims. The drawings described are only schematic and are non-limiting.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein. The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B. Similarly, it is to be noticed that the term "coupled", also used in the description or claims, should not be interpreted as being restricted to direct connections only.

Thus, the scope of the expression "a device A coupled to a device B" should not be limited to devices or systems wherein an output of device A is directly connected to an input of device B. It means that there exists a path between an output of A and an input of B which may be a path including other devices or means.

References to software can encompass any type of programs in any language executable directly or indirectly by a processor.

References to logic, hardware, processor or circuitry can encompass any kind of logic or analog circuitry, integrated to any degree, and not limited to general purpose processors, digital signal processors, ASICs, FPGAs, discrete components or transistor logic gates and The present application relates to all forms of capacitor or battery cells. Certain battery models use a capacitor as main storage element. However, this might not be accurate in the operating areas where accuracy is required (near full, near empty).

The capacity of a capacitor cell can be expressed in farad equivalent to ampere second/volt or As/V or Coulomb/volt, or C/V.

The capacity of a battery cell is expressed in ampere hour which is equal to 3600 As or 3600 Coulomb or 3600 C. However in SI units, the battery capacity must be expressed in As or Coulomb C. This allows the use of the simple formulas as no conversion factors are required.

First Embodiment

According to a first aspect of the present invention, a system and method and component parts are provided for balancing charge over a plurality of rechargeable energy storage devices coupled, for example in series. Battery (or storage) management involves two requirements:

1. determining the overall system's capability to receive or deliver energy and communicating this to the load/charger.
2. managing (balancing) individual cells in such a way that the system's overall performance is maximized and individual cells are protected against abuse.

FIG. 1 illustrates a rechargeable energy storage system 10 according to an embodiment of the present invention. The method carried out by this storage system 10 is defined in the third embodiment. A central controller 20 and a controller 18 co-operate to execute this method.

The rechargeable energy storage system 10 comprises a series string 11 of a plurality of energy storage devices 12, also called cells. The energy storage devices 12 are rechargeable. Each one energy storage device 12 can comprise a single energy storage cell or a parallel connection of multiple energy storage cells (not illustrated). The series-connected rechargeable energy storage devices 12 together form a battery, a pack or a stack. In accordance with embodiments of the present invention, the rechargeable energy storage devices 12 may be any type of rechargeable energy storage device. However, devices and methods of the present invention are advantageously used with ultracapacitors and in particular with lithium capacitors or lithium batteries. According to particular embodiments of the present invention, the energy storage devices 12 may be ultracapacitors, also known as supercapacitors or electric double-layer capacitors (EDLCs). These are electrostatic capacitors that have an unusually high energy density when compared to common capacitors; typically of the order of thousands of times greater than a high capacity electrolytic capacitor. Typical capacitance values may range from a few farads to a few thousands of farads. In alternative embodiments, the rechargeable energy storage devices 12 may be Lithium capacitors or batteries, for example high energy-density batteries, such as for example Lithium or Lithium Ion (LiIon) batteries. Lithium capacitors have a low energy density compared to batteries and are extremely vulnerable to both overvoltage or undervoltage voltage conditions thus requiring accurate balancing both by charging and by discharging. Other kinds of rechargeable energy storage devices can equally be used. Preferred applications are in the fields of energy smoothing and momentary load devices, which require very high instant powers compared to the average power ratings.

In accordance with embodiments of the present invention, each rechargeable energy storage device 12 has a limited operating voltage, e.g. between 2 and 4 V. In order to obtain a useful operating voltage of, for example, a few tens to a few hundreds of Volts or even more, useful e.g. as an energy source in vehicle applications, a plurality, and sometimes a large number of rechargeable energy storage devices 12 need to be coupled in series. Slight differences between the energy storage devices 12 in a string or series-coupling can produce imbalances in the cell voltages, which may greatly reduce the string's charge capacity.

In order to alleviate this, a rechargeable energy storage system 10 according to embodiments of the present invention also comprises a system 13 for balancing charge over the plurality of rechargeable energy storage devices 12.

The system 13 for balancing charge comprises an AC signal generator 14 for charging or discharging one or more of the plurality of rechargeable energy storage devices 12. The system 13 furthermore comprises a plurality of balancing units 15. Each balancing unit 15 is assigned to one of the rechargeable energy storage devices 12. For optimal performance, each rechargeable energy storage device 12 is assigned a balancing unit 15.

Each energy storage device 12 in the string 11 is provided with a first terminal 16, which is its positive terminal, and a second terminal 17 which is its negative terminal. The energy storage devices 12 are coupled in the string 11 such that a positive terminal 16 of a first energy storage device 12 is coupled to a negative terminal 17 of a second energy storage device, and so on. The negative terminal 17 of the very first energy storage device 12 in the string, and the positive terminal 16 of the very last energy storage device 12 in the string are accessible from outside.

Figure 2:
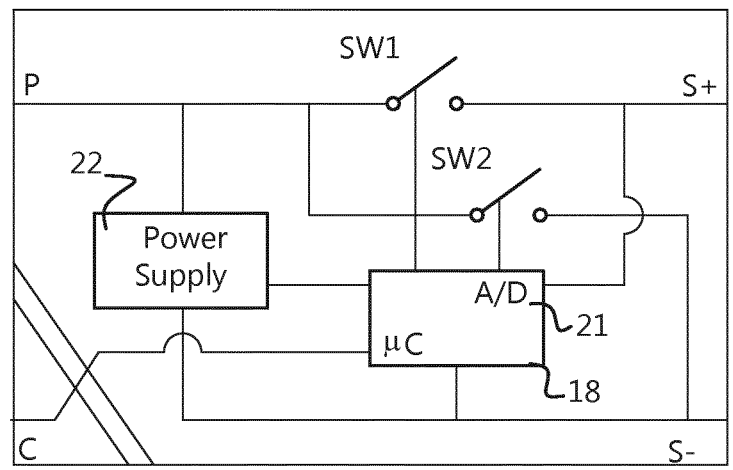
FIG. 2 is a detail of the circuit diagram of FIG. 1.

A balancing unit 15 according to embodiments of the present invention is schematically illustrated in an enlarged format in FIG. 2. It has a first data input port S+ and a second data input port S−. The first and second terminals 16, 17 of an energy storage device 12 are connected to the first and second data input ports S+, S− of the balancing unit 15 assigned to that energy storage device 12, so that the positive terminal 16 of the energy storage device 12 is connected to the first data input port S+ and the negative terminal 17 of the energy storage device 12 is connected to the second data input port S−. The balancing unit 15 is adapted for measuring an instantaneous electrical parameter of the associated energy storage device 12, e.g. the voltage across the two data input ports S+ and S−. In order to obtain this, the balancing unit 15 is provided with suitable measurement circuitry. In an embodiment of the present invention, this measurement circuitry is an analog input of an analog to digital converter 21 of the local microcontroller 18 present in the balancing unit 15. From the measured voltage, a charge value can be calculated as described below. Alternatively, the instantaneous electrical parameter to be measured can be current. From the measured current, a charge value can be calculated as described below.

The balancing unit 15 according to embodiments of the present invention furthermore comprises an input terminal P for receiving an input signal. This input terminal is electrically connected, over a first switch SW1 and a second switch SW2, to the first and second data input ports S+ and S−, respectively. The input signal is received from the AC signal generator 14. The balancing unit 15 is adapted for actuating the first and second switches SW1, SW2 in function of the voltage level at input terminal P. This actuation of the switches SW1, SW2 is controlled by a controller 18. The controller 18 can work in co-operation with a main controller 20. The control function may be concentrated in one controller or may be distributed over two or more levels. FIG. 1 shows 2 levels of controller but more may be used.

The configuration and operation of this controller or these controllers is relevant to embodiments of the present invention.

The switches SW1 and SW2 can be implemented by any suitable implementation. The switches SW1 and SW2 can be active switches. Examples of active switches can be TRIACs or transistors such as bipolar transistors, MOSFETs. The switches SW1 and SW2 determine the direction of the current through the energy storage device depending on the requirement of charging, discharging or leaving the energy storage device unamended. In case the switches SW1 and SW2 are active switches, they can be controlled per period of the AC signal generator 14. As an example, they may have to be open during 50 μs, closed during 50 μs and so on. This makes the controlling current flow through the active switches flexible.

Figure 3:
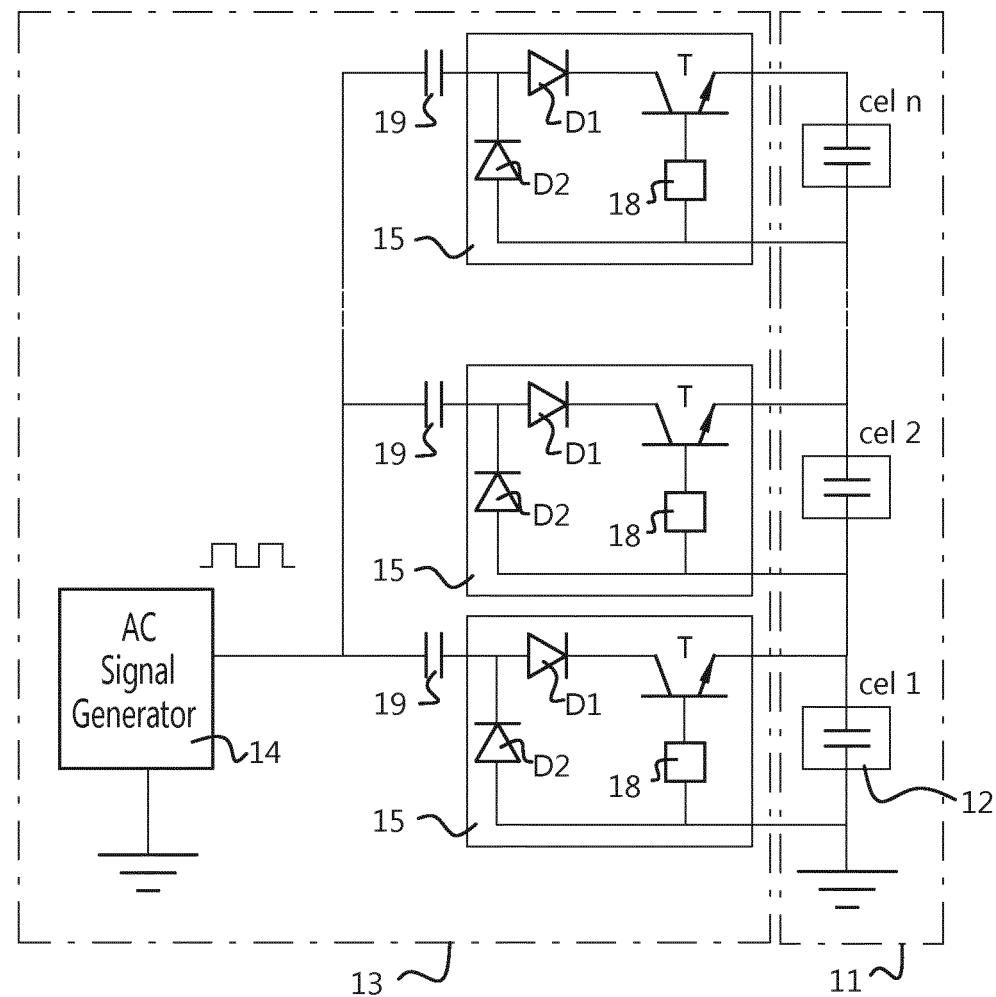
FIG. 3 is a circuit diagram of a balancing system according to another embodiment of the present invention.

In alternative embodiments of the present invention, the switches SW1, SW2 can be passive switches, for example implemented by diodes D1, D2, as illustrated in FIG. 3. A further switch, which can be implemented by any suitable device, illustrated by means of a transistor T in FIG. 3, may be provided in order to change the direction of the current through the diodes in function of the instruction to charge, discharge or leave the energy storage device unamended. This discloses a method and hardware to control balancing including charging or discharging. The controlling of this further switch is not so complex as it is not required to control the further switch per halve period of the AC signal generator 14, but it nevertheless has the same flexibility. The further switch, in the case illustrated a transistor T, is switched on as soon as charging is started, and is blocked (switched off) when charging is stopped (balancing). This may for example be something like one hour later.

A balancing unit 15 according to embodiments of the present invention performs at least the following functions:
  measuring an instantaneous parameter, e.g. the voltage across the data input ports S+, S− of the associated energy storage device 12, and
  actuating the switches SW1, SW2 in function of the voltage level received from the AC signal generator 14 at input terminal P.
    actuating the switches SW1, SW2 so as to carry out the method of the third embodiment.

According to embodiments of the present invention, all balancing units 15 of the system 13 for balancing are coupled to the AC signal generator 14. This AC signal generator 14 can be a block wave generator, a sinusoidal signal source, a saw tooth generator, or any other type of AC signal generator. It is advantageous if the AC signal generator 14 is a high frequency signal generator, as this reduces component size. A sinusoidal signal generator is more efficient, has low peak currents hence low heat generation, and does not substantially present any switching losses. However, a block wave generator is easier to implement than a sinusoidal signal generator. The AC signal generator 14 can be powered from an external source (not illustrated), e.g. a charger, or from the series string 11 of energy storage devices 12. The AC signal generator 14 can be controlled by the main controller 20. It is advantageous to have a single AC signal generator 14 for the balancing system 13. This embodiment is different from any prior art solutions, for example, where an AC signal generator is required in each balancing unit.

According to embodiments of the present invention, a plurality of AC signal generators are provided (not illustrated), and the plurality of balancing units are grouped into groups, the balancing units of one group being coupled to one of the AC signal generators. Also in this case it can be said that the system for balancing comprises a single AC signal generator, the signal generator and the group of balancing units coupled thereto forming the system for balancing. No signal generator is required in the balancing units. Advantageously a synchronously phase shifted signal may be used for reducing ripple in the local power supply of the signal generator and/or the controller.

According to embodiments of the present invention, the balancing units 15 are coupled to the AC signal generator by means of a capacitor 19. The capacitive coupling provided by the capacitors 19 is used to block common mode voltages. This is required because the energy storage devices 12 are at different and varying potential levels.

The balancing units 15, or thus the system 13 for balancing, functions as follows. Each balancing circuit 15 in first instance measures a local instantaneous electrical parameter of the associated energy storage device 12, e.g. the local voltage across its first and second terminals 16, 17, i.e. the voltage across the associated energy storage device 12. In accordance with embodiments of the present invention, this measuring can be performed via a method and device as disclosed in WO 2006/058394. In accordance with embodiments of the present invention, the measurement can be performed by means of an A/D converter, for example an A/D converter 21 which forms part of a local controller 18, local to the balancing unit 15.

Figure 4:
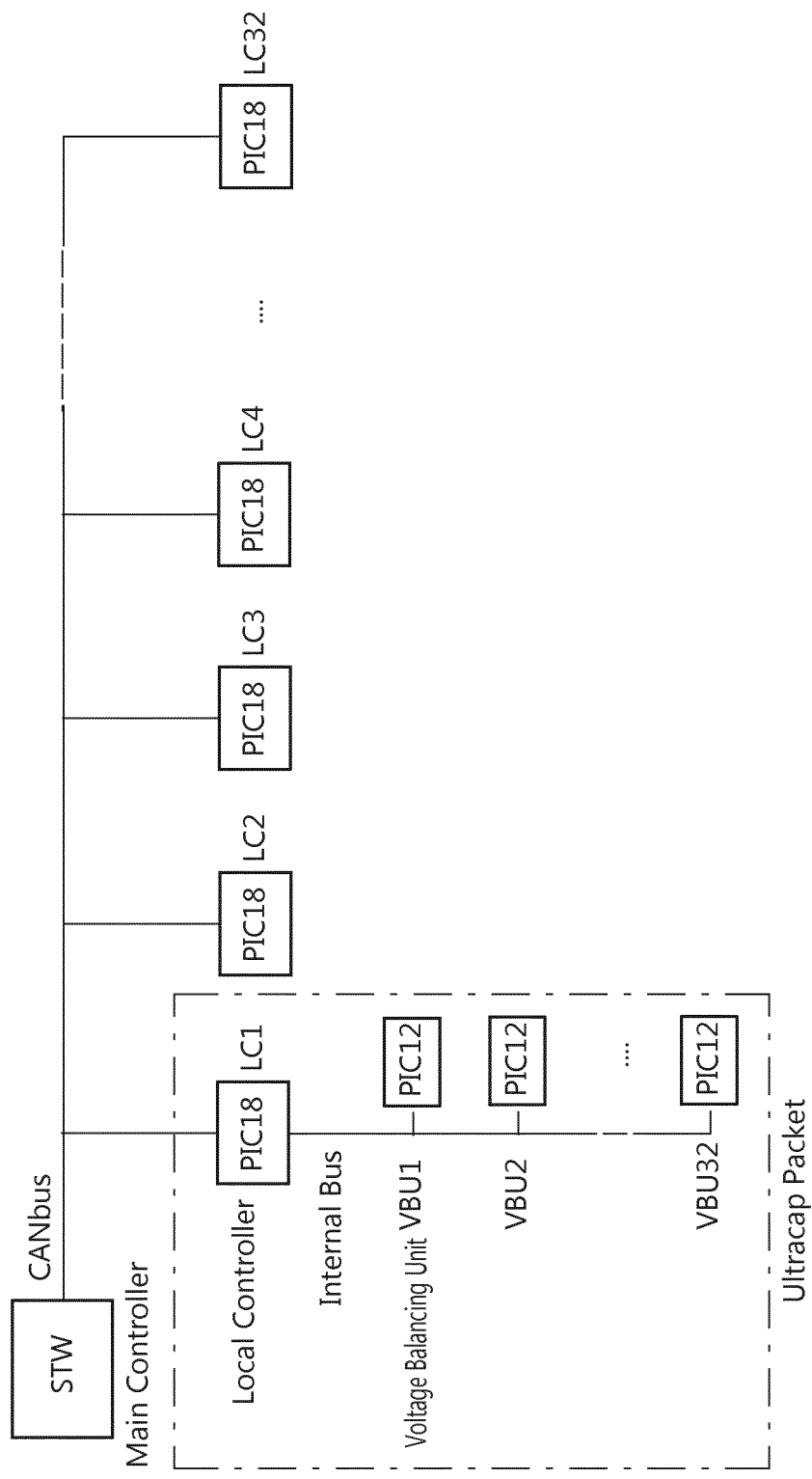
FIG. 4 is a diagram of a control circuit according to an embodiment of the present invention.

In accordance with embodiments of the present invention, a measuring circuit may digitize the measured values, e.g. voltages, and transmit them to a local controller LC1 in FIG. 4. The measured parameter value, e.g. voltage, determines whether the cell 12 is operating in a region where charging or discharging is required. The measured parameter value, e.g. voltage, is compared to a corresponding local reference value, e.g. voltage, that may be stored in the local controller LC1, in a main controller 20 or in an associated memory (not illustrated). This comparison identifies whether the cell 12 needs charging or discharging: if the measured parameter value, e.g. voltage, exceeds the local reference value, e.g. voltage, with at least a first pre-determined threshold value, the cell 12 needs discharging, and if the measured parameter value, e.g. voltage, is at least a second predetermined threshold value below the reference value, e.g. voltage, the cell 12 needs charging. The first and the second threshold values may be the same. In alternative embodiments, they may be different.

The methods carried out by the above described hardware are those of any or some or all of the third embodiment.

Second Embodiment

An embodiment of the present invention describing balancing system can be implemented by a digital device with processing capability including one or more microprocessors, processors, controllers, or central processing units (CPU) and/or a Graphics Processing Units (GPU), means of communication and can be adapted to carry out the respective functions or tests by being programmed with software, i.e. one or more computer programs.

Such a device may have memory (such as non-transitory computer readable medium, RAM and/or ROM), an operating system, optionally a display such as a fixed format display such as an OLED display, data entry devices such as a keyboard, a pointer device such as a "mouse", serial or parallel ports to communicate with other devices, network cards and connections to connect to a network.

A system architecture of a rechargeable energy storage system according to this embodiment is shown schematically in FIG. 4. The processes that are implemented in a central controller that allow correct balancing decisions to be made have been described above.

The rechargeable energy storage system is not shown in detail in FIG. 4. It comprise a series string of a plurality of energy storage devices also called cells. The energy storage devices are rechargeable. Each one energy storage device can comprise a single energy storage cell or a parallel connection of multiple energy storage cells. The series-connected rechargeable energy storage devices together form a battery, a pack or a stack, i.e. a physical unit. In accordance with embodiments of the present invention, the rechargeable energy storage devices may be any type of rechargeable energy storage device. However, devices and methods of the present invention are advantageously used with ultracapacitors and in particular with lithium capacitors or lithium batteries. According to this embodiment of the present invention, the energy storage devices may be ultracapacitors, also known as supercapacitors or electric double-layer capacitors (EDLCs). These are electrostatic capacitors that have an unusually high energy density when compared to common capacitors; typically on the order of thousands of times greater than a high capacity electrolytic capacitor. Typical capacitance values may range from a few farads to a few thousands of farads. In alternative embodiments, the rechargeable energy storage devices may be batteries or Lithium capacitors, for example high energy-density batteries, such as for example Lithium or Lithium Ion (LiIon) batteries. Lithium capacitors have a low energy density compared to batteries and are extremely vulnerable to both over or under voltage conditions thus requiring accurate balancing both by charging and by discharging. Other kinds of rechargeable energy storage devices can equally be used. Preferred applications are in the fields of energy smoothing and momentary load devices, which require very high instant powers compared to the average power ratings.

In FIG. 4, a main controller (labelled STW) is provided as a central controller which communicates with any or some or all of a charging device, a load on the system for discharging, a user of the system and an application. The main controller STW consolidates cell information to individual balancing decisions and consolidates cell information to over/under voltage protection information for the charger, the load to discharge, the user and the application.

A local controller such as a microcontroller (labelled LC1 etc e.g. a microcontroller such as PIC18), which can be on a bus linked to the main controller STW, is provided as an intermediate gateway for retransmitting relevant data from cell level to top level and vice versa. It reduces communication load on main controller STW. The bus can be part of a Controller Area Network or CAN. A microcontroller such as PIC18 is at module level along with other modules with their local controllers (LC): microcontroller such as PIC 18, LC1, LC2, LC3, LC4 . . . LC32 . . . LCm A voltage balancing unit e.g. a microcontroller (labelled VBU1 such as a microcontroller PIC12) is provided at cell level which is a monitoring and balancing unit, e.g. with one per cell. The voltage balancing units VBU1, VBU2 . . . . VBU32 . . . VBUn such as a microcontroller PIC12 can be linked by an internal bus in a string just as the cells 12 are linked in a string. In this embodiment the voltage balancing unit VBU1, VBU2 . . . VBU32 . . . VBUn e.g. microcontroller such as PIC12 does not need to contain decision making capability except for providing low level safety. It transmits information to the intermediate gateway LC1 e.g. microcontroller such as PIC18. It contains means adapted to execute balancing commands supplied from the main controller STW, e.g. via LC1 e.g. microcontroller such as PIC18.

The method that is carried out by the combined controllers STW and any of LC1, LC2, LC3, LC4 . . . LC32 . . . LCm e.g. a microcontroller such as PIC18 as well as the balancing units VBU1, VBU2 . . . . VBU32 . . . VBUn e.g.

as a microcontroller such as PIC12 is in accordance with any or all of the methods of the third embodiment.

Third Embodiment

The methods described in the third embodiments are implemented by any of the embodiments describing the components of the system such as the first and second embodiments.

The methods of the third embodiment can be used in a system for balancing individual electric energy storage cells in an electric energy storage system according to any of the embodiments. The methods of the third embodiment can be used with individual energy storage devices connected in series, means for measuring an electrical parameter of individual cells related to cell health, charge or state of charge, a controller, means for reporting measured parameter values to the controller, the controller being adapted to decide if one or more individual cells are to be balanced and in which direction, the decision being based on the measured parameter, a balancing unit being connected to a measured cell and being adapted for receiving a balancing command from the controller and for performing cell balancing of the cell connected to it independently of whether the energy storage system as a whole is being charged or discharged or is idle.

The operation of the local controller 18 (FIG. 1, 2, 3) or LC1 (FIG. 4) and the main controller 20 (FIG. 1) or STW (FIG. 4) and the balancing circuits (such as those shown in FIGS. 1 to 4 including VBU1, VBU2 . . . . VBU32 . . . VBUn) and units according to further embodiments of the present invention will now be described. The balancing strategy according to embodiments of the present invention depends on the type of cells to be balanced. The strategy assumes that taking a balancing decision and balancing itself are two different processes.

Cell Balancing of Capacitor Cells:

Each cell has a maximum safe voltage Vmax. The actual measured voltage of the nth cell is Vn.

$$(V_{max}-V_n)*C_n=Q_n \quad (1)$$

where
$V_{max}$=maximum allowed cell voltage
$V_n$=voltage of cell n [V]
$C_n$=capacity of cell n [F]
$Q_n$=the charge that can be accepted [C]

The value of Q relates to the charge that can be accepted by the cell to bring it to maximum charge and voltage.

The total system (string of series cells) voltage, and therefore the charge stored, is equal to the sum of all cell voltages. Hence, it is preferable that all cells reach their maximum voltage simultaneously. The system can be charged until one cell reaches its maximum voltage Vmax. Charging should stop at that point. Then the cell with the lowest value for Q will be discharged. The lowest value of Q means the cell closest to fully charged will be discharged. Thus the lowest value for Q increases and therefore the capacity of the system increases. The cell will be discharged independent of what the system is doing at the time, i.e. independently of whether the energy storage device is discharging into a load or is being charged. Hence the cell is selected with the lowest value of Q which is a step of finding which cells to balance and a means for performing the finding operation.

Similarly, if energy storage cells need to be operated close to a minimum voltage limit, as could be the case for Lithium Ion Capacitors, the cell with the lowest value for Q' will require charging. Q' is the amount of charge left in the energy cell. $V_{min}$ is the lowest allowed voltage, i.e. a state of complete useful discharge.

$$(V_n-V_{min})*C_n=Q'_n \quad (2)$$

Thus a cell requiring charge will be charged independently of what the system is doing at the time, i.e. independently of whether the energy storage device is discharging into a load or is being charged.

Note that the cells requiring charging or discharging are not necessarily the cells with the lowest or highest voltage. If cells have different capacities then a small cell will be controlled in a different way than a large cell. The cell with the lowest $C_n$ will often be a candidate for balancing because its Q or Q' value can be more extreme.

$C_n$ decreases with age. If $C_n$ cannot be determined or is not known accurately during normal operation errors will occur. In order to limit the consequences of these errors, formula (1) should be evaluated when $V_n$ is close to $V_{max}$ or close to $V_{min}$ in the case of equation (2). To implement this a threshold value $V_t$ can be created such that $$V_t=V_{max}-k*t-S \quad (3)$$

where
k=a decay constant expressed in V/s (e.g. 0.01 V/sec)
t=elapsed time since last evaluation.
S=a safety margin to avoid unwanted behaviour e.g. immediately after starting or after cell replacements.

If any $V_n$ exceeds $V_t$, formula (1) is evaluated, t is reset to 0 and balancing decisions are made. Similarly for $V_{min}$:

As a further step a threshold value $V'_t$ can be calculated in accordance with equation (4)

$$V'_t=V_{min}+k*t+S \quad (4)$$

where
k=a decay constant expressed in V/s (e.g. 0.01 V/sec)
t=elapsed time since last evaluation.
S=a safety margin to avoid unwanted behaviour e.g. immediately after starting or after cell replacements, and if Vn is lower than $V'_t$, equation (2) is evaluated, t is reset to 0 and balancing decisions are made.

This method ensures that if the system is operated near a limit, the balancing decision is taken frequently and accuracy is high. If the system operates in an intermediate voltage range, equations (1) or (2) will have less accuracy so the algorithm relies on previous decisions for a longer time.

In embodiments of the present invention once the balancing decision is taken, balancing can be started for a preset time cell-by-cell:

$$t_{balance}=Q_n/I_{balance} \text{ or } t_{balance}=Q'_n/I_{balance} \quad (5)$$

where $t_{balance}$ is the time set for balancing, $Q_n$ and $Q'_n$ are as explained above, and $I_{balance}$ is the balancing current used.

This discloses a means for and a method step of determining how long the balancing should go on, e.g. for capacitor cells.

Cell Balancing of Battery Cells:

$$(1-SoC)*C_n=Q_n \quad (1')$$

$$(SoC)*C_n=Q'_n \quad (2')$$

Where $C_n$ is the cell capacity in C or As.

In accordance with this embodiment of the present invention the balancing method for capacitors described above can be applied to batteries the SoC can be used for the calculation of $Q_n$ or $Q'_n$ which is used in the decision to balance as described above. Similar to capacitor balancing optimal system performance is achieved talking into account the cell's capacity.

System Optimization—Overall System Capacity

A battery management system (BMS) should be able to communicate to a bulk load or charger when to end charging and/or discharging. This can be done by checking individual cell voltages against their upper or lower limits and interrupting charge or discharge when a voltage goes beyond a limit. However, when the current to/from a storage device is interrupted, the voltage will abruptly change. All voltages will return to values within their limits which may lead to switching on of the load/charger discovering that the limits are again immediately exceeded. This oscillating behaviour is not desired. To avoid this behaviour, in absence of cell voltage measurements, the system voltage can be used to compare to a limit value.

For capacitor cell systems, the limit value can be calculated as follows:

If individual cell capacities are not known, they are considered equal $$V_{upperlimit} = V_{system} + N*(V_{max} - V_n) \quad (6)$$

where $V_{max}$=upper limit of cell voltage
$V_n$=highest individual cell voltage If the individual cell capacities are known:
using (1), calculate $Q_n$, retain the lowest value: $Q_1$ $$V_{upperlimit} = \Sigma_{n=1 \ldots N}(V_n + Q_1/C_n) \quad (7)$$

For battery cell systems, the limit value is calculated as follows:

If individual cell capacities are not known, they can be considered equal (as a first approximation) and equation (8) can be used. If the relationship between SoC and cell voltage is not known, equation (8) can be used.

$$V_{upperlimit} = V_{system} + N*(V_{max} - V_n) \quad (8)$$

If the individual cell capacities are known and the relationship between SoC and cell voltage is known, e.g. as part of the algorithm to determine SoC: using equation (1'), calculate $Q_n$, retain the lowest value: $Q_1$ for every cell, calculate the expected voltage when adding $Q_1$:

$$V_{nf} = \text{lookup\_EMF}(SoC + Q_1/C_n)$$

$$V_{upperlimit} = \Sigma_{n=1 \ldots N} V_{nf}$$

The function lookup_EMF allows to determine a cell voltage based on its SoC. The relationship is generally supplied as part of a battery cell's data sheet and sometimes referred to as "voltage vs SoC" curve.

$Q_1$ represents the total charge that the battery system can store until the smallest cell is full. It can be expressed in As (Ampere seconds) so if the current is known, the remaining charging time can be calculated. If a battery model is used to estimate cell SoC and cell capacity, this model will usually allow to convert a measured voltage and a predicted charge to a predicted voltage taking into account internal resistance. This voltage is used as upper limit voltage.

It is clear that from the preceding description, data and commands need to be exchanged between cells and a main decision making algorithm. In an aspect of the present invention a layered architecture is provided:

1. in the second embodiment, at cell level there is provided a monitor and balancing unit capable of measuring voltage and temperature and activating a charging or discharging circuit.
2. In the second embodiment, at module level a controller is provided that groups data from a limited number of cells and provides commands to these together with power required to charge-balance.
3. in the second embodiment, at system level a controller is provided that receives only relevant data from module controllers, makes the balancing decisions as described above, retransmits balancing commands to the module controllers and communicates with loads/chargers.
4. Each module retransmits to the main controller the upper and lower values for $V_n$ or $Q_n$ depending on the chosen strategy thus limiting data traffic to the main controller.

In another aspect of the present invention a layered architecture is provided:

1. in the first embodiment, at cell level there is provided a monitor and balancing unit capable of measuring voltage and temperature and activating a charging or discharging circuit.
2. In the first embodiment, at module level a controller is provided that groups data from a limited number of cells and provides commands to these together with power required to charge-balance. Hence, it makes the balancing decisions as described above for the second embodiment, transmits balancing commands to the monitor and balancing units and communicates with loads/chargers.

Figure 5:
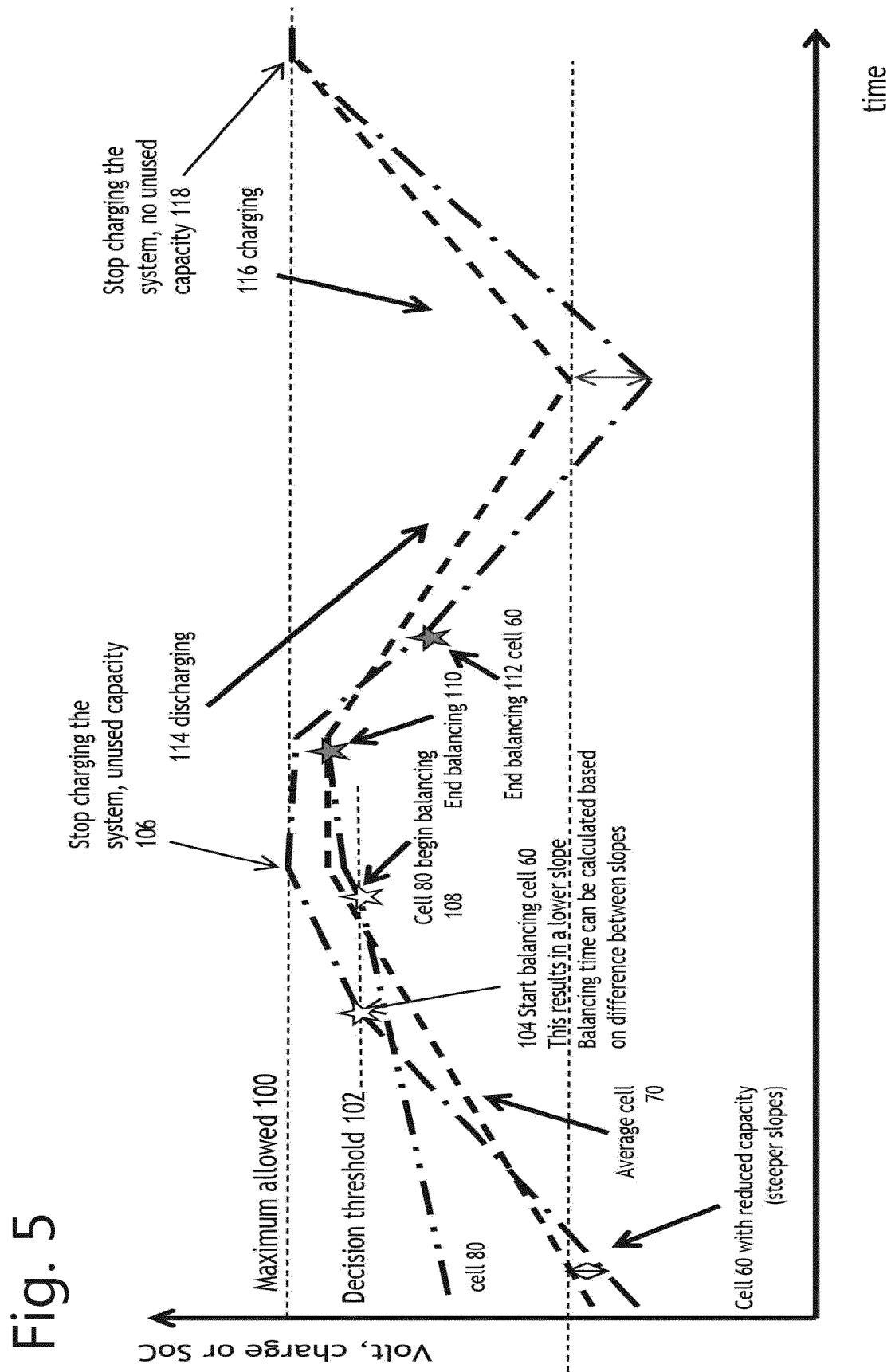
FIG. 5 shows a graph of voltage, charge or SoC for the vertical axis and time along the horizontal axis during balancing in accordance with embodiments of the present invention.

FIG. 5 shows a graph of voltage, charge or SoC for the vertical axis and time along the horizontal axis during balancing in accordance with embodiments of the present invention. The maximum limit allowed 100 means that charging of the system is terminated if a cell reaches this maximum. There is a threshold 102 when a decision on balancing is taken.

In FIG. 5 a steeper slope means that the voltage changes more quickly as charge is added or removed from the cells. The voltage of cells with smaller capacity changes faster than that of larger cells so slopes are steeper.

If the system is charging and if there is balancing with discharge in accordance with embodiments of the present invention, the slopes are less.

Cell 60 has a lower capacity than average and hence charges up faster. It therefore reaches the decision threshold 102 earlier than the average cell 70 and balancing starts in step 104 for cell 60. The average cell 70 will reach a lower charge or voltage or SoC when the cell 60 reaches the maximum at step 106. This means there is unused capacity in the system.

When the system is discharging in step 114, the balancing of cell 60 continues in discharge so that the slope is steeper and becomes more shallow when balancing stops in step 112. The steeper slope initially means that the cell 60 reaches a lower voltage, charge or SoC than the average cell 70 when the system starts to charge again in step 116. As cell 60 starts to charge from a lower level and even despite the slope being steeper than the average cell 70, there is no waste capacity at step 118. The charging of the system is in step 116 and if the balancing has been done optimally whereby balancing by charging or discharging can be selected freely independent of whether the whole system is charging, discharging or is idle then there is no waste capacity at the maximum 118.

In accordance with embodiments of the present invention, if an additional cell 80 (one dash and two dots) deviates from the average cell 70 and crosses the threshold 102 at any point in time, a decision can be made for that cell about balancing. It will be at a different point in time, and in accordance with embodiments of the present invention the balancing time may be different, and the charge direction may be different. For example balancing starts at step 108 and stops at step 110.

In this example there is one cell balancing by charging while another is balancing with discharging at the same time. Hence the balancing is independent of whether the complete system is charging or discharging or is idle.

Implementation

An embodiment of the present invention describing balancing system can be implemented by a digital device with processing capability including one or more microprocessors, processors, controllers, or central processing units (CPU) and/or a Graphics Processing Units (GPU), means of communication such as described with reference to the first and second embodiment, any of which can be adapted to carry out the respective functions or tests by being programmed with software, i.e. one or more computer programs.

Such a device may have memory (such as non-transitory computer readable medium, RAM and/or ROM), an operating system, optionally a display such as a fixed format display such as an OLED display, data entry devices such as a keyboard, a pointer device such as a "mouse", serial or parallel ports to communicate with other devices, network cards and connections to connect to a network.

The software can be embodied in a computer program product adapted to carry out the following functions for balancing individual electric energy storage devices in an electric energy storage system comprising individual energy storage devices connected in series, when the software is loaded onto the respective device or devices and executed on one or more processing engines such as microprocessors, ASIC's, FPGA's etc.:

measuring an electrical parameter of individual energy storage devices related to device health, charge or state of charge.

The software is embodied in the computer program product and adapted to carry out the following functions when the software is loaded onto the respective device or devices and executed on one or more processing engines such as microprocessors, ASIC's, FPGA's etc.:

deciding if one or more individual energy storage devices are to be balanced and in which direction, the decision being based on the measured parameter values.

The software is embodied in the computer program product and adapted to carry out the following functions when the software is loaded onto the respective device or devices and executed on one or more processing engines such as microprocessors, ASIC's, FPGA's etc.:

performing balancing of the one or more energy storage devices independently of whether the energy storage system as a whole is being charged or discharged or is idle.

The software is embodied in the computer program product and adapted to carry out the following functions when the software is loaded onto the respective device or devices and executed on one or more processing engines such as microprocessors, ASIC's, FPGA's etc.: balancing carried out according to any of the following:

(i) at any time, or
(ii) balancing is not restricted to the balanced energy storage device being in a certain situation state of charge, or
(iii) without regard for individual performance, or
(iv) with regard to optimal system performance leading to higher energy storage capacity, or
(v) to prevent overvoltage or undervoltage on cells by the controller being adapted calculate a maximum system or a minimum system voltage based on a highest or lowest individual cell voltage, respectively, or
(vi) without use of a balancing charger, or
(vii) the controller taking account for differences in cell capacity and internal resistance in predictions of voltage or SoC, or
(viii) for a set period of time.

The software is embodied in the computer program product and adapted to carry out the following functions when the software is loaded onto the respective device or devices and executed on one or more processing engines such as microprocessors, ASIC's, FPGA's etc.:

transferring, on the one hand, charge from an electric charging device or from an energy storage device assigned to another balancing unit for charging the energy storage device assigned to the first balancing unit, and, on the other hand, for transferring charge to the electric charging device or to an energy storage device assigned to another balancing unit for discharging the energy storage device assigned to the first balancing unit independently of whether the energy storage system as a whole is being charged or discharged or is idle.

The software is embodied in the computer program product and adapted to carry out the following functions when the software is loaded onto the respective device or devices and executed on one or more processing engines such as microprocessors, ASIC's, FPGA's etc.: comparing a measured electrical parameter of an energy storage device with a corresponding reference parameter or threshold value, and/or the electrical parameter can be a derived value such as an amount of charge in the energy storage device or an amount of charge left in the energy storage device or a SoC of the energy storage device.

The software is embodied in the computer program product and adapted to carry out the following functions when the software is loaded onto the respective device or devices and executed on one or more processing engines such as microprocessors, ASIC's, FPGA's etc.:

comparing a measured electrical parameter of an energy storage device with a corresponding reference parameter or threshold value and/or controlling the switches based on a signal generated in accordance with the measured electrical parameter.

The software is embodied in the computer program product and adapted to carry out the following functions when the software is loaded onto the respective device or devices and executed on one or more processing engines such as microprocessors, ASIC's, FPGA's etc.: protecting the rechargeable energy storage devices against overvoltage and/or undervoltage.

The software is embodied in the computer program product and adapted to carry out the following functions when the software is loaded onto the respective device or devices and executed on one or more processing engines such as microprocessors, ASIC's, FPGA's etc.:

Calculating $Q_n$:

Each rechargeable energy storage device or cell has a maximum safe voltage $V_{max}$, and the actual measured voltage of the nth cell is $V_n$ and $Q_n$ is given by equation (1):

$$(V_{max} - V_n) * C_n = Q_n \quad (1)$$

where
$V_{max}$=maximum allowed cell voltage
$V_n$=voltage of cell n [V]
$C_n$=capacity of cell n [F]
$Q_n$=the charge that can be accepted [C]

whereby the value of $Q_n$ relates to the charge that can be accepted by the cell to bring it to maximum charge and voltage, the cell with the lowest value of Q is discharged.

Hence the cell is selected with the lowest value of Q which is a step of finding which cells to balance and a means for performing the finding operation.

The value $C_n$ in any of the formulas relates to the health of a cell, hence determining $C_n$ is a step of determining the health of a cell as well as providing a means to determine the health.

The cell will be discharged independently of whether the energy storage device is discharging into a load or is being charged or is idle.

The software is embodied in the computer program product and adapted to carry out the following functions when the software is loaded onto the respective device or devices and executed on one or more processing engines such as microprocessors, ASIC's, FPGA's etc.:

Calculating $Q'_n$:

Q' is the amount of charge left in an energy cell, $V_{min}$ is the lowest allowed voltage state of complete useful discharge, and $Q_n$ is given by equation (2):

$$(V_n - V_{min})^* C_n = Q'_n \quad (2)$$

the cell with the lowest value of Q' is charged independently of whether the energy storage device is discharging into a load or is being charged or is idle.

Hence the cell is selected with the lowest value of Q' which is a step of finding which cells to balance and a means for performing the finding operation.

The software is embodied in the computer program product and adapted to carry out the following functions when the software is loaded onto the respective device or devices and executed on one or more processing engines such as microprocessors, ASIC's, FPGA's etc.:

Equation (1) can be evaluated when $V_n$ is close to $V_{max}$ or equation (2) can be evaluated when $V_n$ is close to $V_{min}$.

As a further step a threshold value $V_t$ can be calculated in accordance with equation 3

$$V_t = V_{max} - k^*t - S \quad (3)$$

where k=a decay constant expressed in V/s (e.g. 0.01 V/sec)
t=elapsed time since last evaluation.
S=a safety margin to avoid unwanted behaviour e.g. immediately after starting or after cell replacements, and if Vn exceeds $V_t$, equation (1) is evaluated, t is reset to 0 and balancing decisions are made.

As a further step a threshold value $V'_t$ can be calculated in accordance with equation 4

$$V'_t = V_{min} + k^*t + S \quad (4)$$

where k=a decay constant expressed in V/s (e.g. 0.01 V/sec)
t=elapsed time since last evaluation.
S=a safety margin to avoid unwanted behaviour e.g. immediately after starting or after cell replacements, and if Vn is lower than $V'_t$, equation (2) is evaluated, t is reset to 0 and balancing decisions are made.

The software is embodied in the computer program product and adapted to carry out the following functions when the software is loaded onto the respective device or devices and executed on one or more processing engines such as microprocessors, ASIC's, FPGA's etc.:

Alternatively $Q_n$ or $Q'_n$ can be calculated by equations (1') and (2') respectively:

$$(1 - SoC)^* C_n = Q_n \quad (1')$$

$$(SoC)^* C_n = Q'_n \quad (2')$$

The software is embodied in the computer program product and adapted to carry out the following functions when the software is loaded onto the respective device or devices and executed on one or more processing engines such as microprocessors, ASIC's, FPGA's etc.:

Balancing can be started for a preset time cell-by-cell as defined in equation (5):

$$t_{balance} = Q_n / I_{balance} \text{ or } t_{balance} = Q'_n / I_{balance} \quad (5)$$

where $t_{balance}$ is the time set for balancing, and $I_{balance}$ is the balancing current used.

This discloses a means for and a method step of determining how long the balancing should go on.

The software is embodied in the computer program product and adapted to carry out the following functions when the software is loaded onto the respective device or devices and executed on one or more processing engines such as microprocessors, ASIC's, FPGA's etc.:

Cell Balancing of Battery Cells:

$$(1 - SoC)^* C_n = Q_n \quad (1')$$

$$(SoC)^* C_n = Q'_n \quad (2')$$

Where $C_n$ is the cell capacity in C or As.

The software is embodied in the computer program product and adapted to carry out the following functions when the software is loaded onto the respective device or devices and executed on one or more processing engines such as microprocessors, ASIC's, FPGA's etc.: balancing method for capacitors described above is applied to batteries whereby the SoC can be used for the calculation of $Q_n$ or $Q'_n$ which is used in the decision to balance as described above, and/or achieving optimal system performance taking into account the cell's capacity.

The software is embodied in the computer program product and adapted to carry out the following functions when the software is loaded onto the respective device or devices and executed on one or more processing engines such as microprocessors, ASIC's, FPGA's etc.:

communicating to a bulk load or charger when to end charging and/or discharging by checking individual cell voltages against their upper or lower limits and interrupting charge or discharge when a voltage goes beyond a limit.

The software is embodied in the computer program product and adapted to carry out the following functions when the software is loaded onto the respective device or devices and executed on one or more processing engines such as microprocessors, ASIC's, FPGA's etc.:

when the current to/from a storage device is interrupted, the voltage will abruptly change whereby to avoid oscillating behaviour, in absence of cell voltage measurements, comparing the system voltage to a limit value, and/or For capacitor cell systems, the limit value can be calculated as follows:

If individual cell capacities are not known, they are considered equal $$V_{upperlimit} = V_{system} + N^*(V_{max} - V_n) \quad (6)$$

where $V_{max}$=upper limit of cell voltage
$V_n$=highest individual cell voltage If the individual cell capacities are known:
using (1), calculate $Q_n$, retain the lowest value: $Q_1$ $$V_{upperlimit} = \Sigma_{n=1\ldots N}(V_n + Q_1/C_n) \tag{7}$$

The software is embodied in the computer program product and adapted to carry out the following functions when the software is loaded onto the respective device or devices and executed on one or more processing engines such as microprocessors, ASIC's, FPGA's etc.:

For battery cell systems, the limit value is calculated as follows:

If individual cell capacities are not known, they can be considered equal (as a first approximation) and equation (8) can be used. If the relationship between SoC and cell voltage is not known, equation (8) can be used.

$$V_{upperlimit} = V_{system} + N^*(V_{max} - V_n) \tag{8}$$

If the individual cell capacities are known and the relationship between SoC and cell voltage is known, e.g. as part of the algorithm to determine SoC: using equation (1'), calculate $Q_n$, retain the lowest value: $Q_1$
for every cell, calculate the expected voltage when adding $Q_1$:

$$V_{nf} = \text{lookup\_EMF}(SoC + Q_1/C_n)$$

$$V_{upperlimit} = \Sigma_{n=1\ldots N} V_{nf}$$

The function lookup_EMF allows to determine a cell voltage based on its SoC. The relationship is generally supplied as part of a battery cell's data sheet and sometimes referred to as "voltage vs SoC" curve.

The computer program product can be stored on a non-transitory signal storage means such as an optical disk (CD-ROM or DVD-ROM, a magnetic disk, a magnetic tape, a solid state memory such as a flash memory.

The invention claimed is:

1. A system for balancing individual electric energy storage cells in an electric energy storage system comprising:
   individual energy storage devices connected in series,
   measurement devices to measure an electrical parameter of individual cells related to cell health, charge or state of charge,
   a controller,
   means for reporting measured parameter values to the controller,
   the controller being adapted to decide if one or more individual cells are to be balanced and in which direction of charging or discharging, the decision being based on the measured parameter,
   a balancing unit being connected to a measured cell and being adapted for measuring an electrical parameter of the measured cell and for receiving a balancing command from the controller and for performing cell balancing of the cell connected to it,
   wherein the balancing unit at least comprises a first balancing unit comprising a plurality of switches for transferring charge, on the one hand, charge from an electric charging device or from an energy storage cell assigned to another balancing unit for charging the energy storage cell assigned to the first balancing unit, and, on the other hand, for transferring charge to the energy charging device or to an energy storage cell assigned to another balancing unit for discharging the energy storage cell assigned to the first balancing unit independently of whether the energy storage system as a whole is being charged or discharged or is idle, and
   wherein the plurality of switches are configured to determine a direction of current through the energy storage cell assigned to the first balancing unit.

2. The system for balancing according to claim 1, further comprising means to determine overall health of the system wherein the controller is adapted to determine health by the capacity of one or more individual energy storage devices.

3. The system for balancing according to claim 1, further comprising means to decide selected from:
   means to decide which individual energy storage devices to balance, wherein which individual energy storage device to balance depends on charging and discharging or the type of individual energy storage devices being batteries or capacitor cells, and
   means to decide whether the direction should be charging or discharging during balancing, wherein whether the direction should be charging or discharging is adapted to batteries or capacitor cells, and
   means to decide for how long the balancing is to be carried out.

4. The system for balancing according to claim 1, further comprising means to report decision information from the controller to the balancing unit as a command wherein the execution of the command is irrespective of the voltage or SoC of the individual energy storage device connected to the balancing unit.

5. The system for balancing according to claim 1, wherein cell balancing is carried out according to any of the following:
   (i) at any time, or
   (ii) balancing is not restricted to the balanced cell being in a certain situation state of charge, without regard for individual performance, or
   (iii) with regard to optimal system performance leading to higher energy storage capacity to prevent overvoltage or undervoltage on cells by the controller being adapted calculate a maximum system or a minimum system voltage based on a highest or lowest individual cell voltage, respectively, or
   (iv) without use of a balancing charger, or
   (v) the controller taking account for differences in cell capacity and internal resistance in predictions of voltage or SoC, or
   (vi) for a set period of time,
   (vii) by monitoring individual energy storage devices wherein the balancing unit is implemented in hardware.

6. The system for balancing according to claim 1, furthermore comprising a comparator for comparing a measured electrical parameter of an energy storage device with a corresponding reference parameter or threshold value.

7. The system for balancing according to claim 1, wherein the electrical parameter is selected from a derived value and an amount of charge in the energy storage device and an amount of charge left in the energy storage device or a SoC of the energy storage device.

8. The system for balancing according to claim 1, wherein the controller is selected from:
   a controller adapted for controlling the switches based on a signal generated by the comparator,
   and a controller adapted for protecting the rechargeable energy storage devices against overvoltage and/or undervoltage.

9. A method for balancing individual electric energy storage devices in an electric energy storage system comprising: individual energy storage devices connected in series, the method comprising:

measuring an electrical parameter of individual energy storage devices related to device health, charge or state of charge, deciding if one or more individual energy storage devices are to be balanced and in which direction charging or discharging, the decision being based on the measured parameter values, and performing balancing of the one or more energy storage devices, wherein performing the balancing comprises transferring charge using a first balancing unit comprising a plurality of switches, on the one hand, charge from an electric charging device or from an energy storage cell assigned to another balancing unit for charging the energy storage cell assigned to the first balancing unit, and, on the other hand, for transferring charge to the energy charging device or to an energy storage cell assigned to another balancing unit for discharging the energy storage cell assigned to the first balancing unit independently of whether the energy storage system as a whole is being charged or discharged or is idle, and wherein the plurality of switches control a direction of current through the energy storage cell assigned to the first balancing unit.

10. The method of claim 9, further comprising a step to determine overall health of the system by a capacity of one or more individual energy storage devices.

11. The method of claim 9, further comprising a step of deciding selected from:
   deciding which individual energy storage devices to balance depending upon charging or discharging or for batteries or capacitor cells, and
   deciding which direction of charging or discharging is to be applied during balancing depending upon whether the individual energy storage devices are batteries or capacitor cells, and
   deciding for how long the balancing being charging or discharging is to be carried out.

12. The method of claim 9, further comprising a step to report decision information for cell monitoring and balancing as a command, and for executing the command irrespective of the voltage or SoC of individual energy storage device to be balanced.

13. The method of claim 9, wherein balancing is carried out according to any of the following:
   (i) at any time, or
   (ii) balancing is not restricted to the balanced energy storage device being in a certain situation state of charge, or
   (iii) without regard for individual performance, or
   (iv) with regard to optimal system performance leading to higher energy storage capacity, or
   (v) to prevent overvoltage or undervoltage on cells by the controller being adapted calculate a maximum system or a minimum system voltage based on a highest or lowest individual cell voltage, respectively, or
   (vi) without use of a balancing charger, or
   (vii) the controller taking account for differences in cell capacity and internal resistance in predictions of voltage or SoC, or
   (viii) for a set period of time, or
   (ix) by cell monitoring using a switch to enable balancing.

14. The method of claim 9, furthermore comprising comparing a measured electrical parameter of an energy storage device with a corresponding reference parameter or threshold value.

15. The method of claim 9, wherein the electrical parameter is a derived value selected from an amount of charge in the energy storage device and an amount of charge left in the energy storage device and a SoC of the energy storage device.

16. The method of claim 15, further comprising controlling the switches based on the compared measured electrical parameter.

17. The method of claim 9, further comprising protecting the rechargeable energy storage devices against overvoltage and/or undervoltage.

18. A non-transitory signal storage means comprising a computer program product that, when executed on a processing engine, implements the method of claim 9.

19. A system for balancing individual electric energy storage cells in an electric energy storage system comprising:
   individual energy storage devices connected in series,
   measurement devices to measure an electrical parameter of individual cells related to cell health, charge or state of charge,
   a controller,
   means for reporting measured parameter values to the controller,
   the controller being adapted to decide if one or more individual cells are to be balanced and in which direction of charging or discharging, the decision being based on the measured parameter,
   a balancing unit being connected to a measured cell and being adapted for measuring an electrical parameter of the measured cell and for receiving a balancing command from the controller and for performing cell balancing of the cell connected to it,
   wherein the balancing unit at least comprises a first balancing unit comprising a first data input port connected to a first terminal of the measured cell, a second data input port connected to a second terminal of the measured cell, an input terminal for receiving an input signal from the controller, said input terminal being electrically connected to the first data input port and the second data input port by a first switch and a second switch,
   wherein the first switch and the second switch are configured for transferring charge, on the one hand, charge from an electric charging device or from an energy storage cell assigned to another balancing unit for charging the energy storage cell assigned to the first balancing unit, and, on the other hand, for transferring charge to the energy charging device or to an energy storage cell assigned to another balancing unit for discharging the energy storage cell assigned to the first balancing unit independently of whether the energy storage system as a whole is being charged or discharged or is idle, and
   wherein the first switch and the second switch are configured to determine a direction of current through the energy storage cell assigned to the first balancing unit.

20. A system for balancing individual electric energy storage cells in an electric energy storage system comprising:
   individual energy storage devices connected in series,
   measurement devices to measure an electrical parameter of individual cells related to cell health, charge or state of charge,
   a controller,
   means for reporting measured parameter values to the controller, the controller being adapted to decide if one or more individual cells are to be balanced and in which direction of charging or discharging, the decision being based on the measured parameter, a balancing unit being connected to a measured cell and being adapted for measuring an electrical parameter of the measured cell and for receiving a balancing command from the controller and for performing cell balancing of the cell connected to it, wherein the balancing unit at least comprises a first balancing unit comprising a plurality of diodes and transistors for transferring charge, on the one hand, charge from an electric charging device or from an energy storage cell assigned to another balancing unit for charging the energy storage cell assigned to the first balancing unit, and, on the other hand, for transferring charge to the energy charging device or to an energy storage cell assigned to another balancing unit for discharging the energy storage cell assigned to the first balancing unit independently of whether the energy storage system as a whole is being charged or discharged or is idle, and wherein the plurality of diodes and transistors are configured to determine a direction of current through the energy storage cell assigned to the first balancing unit.

* * * * *